United States Patent [19]

Turner et al.

[11] Patent Number: 5,674,786
[45] Date of Patent: Oct. 7, 1997

[54] METHOD OF HEATING AND COOLING LARGE AREA GLASS SUBSTRATES

[75] Inventors: Norman L. Turner, Mountain View; John MacNeill White; David Berkstresser, both of Los Gatos, all of Calif.

[73] Assignee: Applied Materials, Inc., Santa Clara, Calif.

[21] Appl. No.: 461,075

[22] Filed: Jun. 5, 1995

Related U.S. Application Data

[62] Division of Ser. No. 10,683, Jan. 28, 1993, Pat. No. 5,607,009.

[51] Int. Cl.$^6$ ............................................. H01L 21/324
[52] U.S. Cl. ................... 437/225; 437/247; 427/314; 414/937; 414/938
[58] Field of Search .......................... 437/225, 247; 427/314; 414/937, 938

[56] References Cited

U.S. PATENT DOCUMENTS

| | | | |
|---|---|---|---|
| 4,016,006 | 4/1977 | Yoshinaka et al. | 437/247 |
| 4,603,243 | 7/1986 | Septfons et al. | 165/61 |
| 4,609,037 | 9/1986 | Wheeler et al. | 165/61 |
| 4,923,584 | 5/1990 | Bramhall, Jr. et al. | 204/298.25 |
| 4,951,601 | 8/1990 | Maydan et al. | 118/719 |
| 4,979,464 | 12/1990 | Kunze-Concewitz et al. | 118/719 |
| 5,097,890 | 3/1992 | Nakao | 165/61 |
| 5,135,047 | 8/1992 | Dobran | 165/48.1 |
| 5,162,047 | 11/1992 | Wada et al. | 29/25.01 |
| 5,192,371 | 3/1993 | Shoto et al. | 118/728 |
| 5,259,881 | 11/1993 | Edwards | 118/719 |
| 5,380,682 | 1/1995 | Edwards | 437/225 |

FOREIGN PATENT DOCUMENTS

| 1243552 | 9/1989 | Japan . |
|---|---|---|
| 2264429 | 10/1990 | Japan . |

*Primary Examiner*—Charles L. Bowers, Jr.
*Assistant Examiner*—Matthew Whipple
*Attorney, Agent, or Firm*—Fish & Richardson P.C.

[57] ABSTRACT

Glass substrates suitable for thin film processing can be batch heated to processing temperatures and batch cooled after processing by radiant heating and cooling in a vacuum chamber. The heating and/or cooling chamber is fitted with a cassette including heat conductive shelves that can be heated or cooled, interleaved by the glass substrates mounted on supports so that a gap exists between the shelves and the substrates. As the shelves provide heating or cooling, the glass substrates are radiantly heated or cooled by the shelves, thereby providing uniform heating or cooling of the glass substrates so as to avoid damage or warpage of the substrates. A vacuum system for processing the substrates includes batch-type heating and cooling of the substrates using the chambers of the invention in combination with one-at-a-time film processing chambers that can deposit one or more thin films on the substrates.

5 Claims, 5 Drawing Sheets

METHOD OF HEATING AND COOLING LARGE AREA GLASS SUBSTRATES

This application is a divisional application of prior U.S. application Ser. No 08/010,683, filed on Jan. 28, 1993, now U.S. Pat. No. 5,607,009.

This invention relates to a heating and cooling method for large glass substrates and for apparatus suitable for carrying out the process. More particularly, this invention relates to a method for heating and cooling large glass substrates during film processing and apparatus therefor.

BACKGROUND OF THE INVENTION

Thin film transistors have been made heretofore on large glass substrates or plates for use in monitors, flat panel displays, solar cells and the like. The transistors are made by sequential deposition of various films including amorphous silicon, both doped and intrinsic, silicon oxide, silicon nitride and the like in a vacuum chamber. Thin films for transistors can be deposited by chemical vapor deposition (hereinafter CVD) for example.

CVD is a comparatively high temperature process requiring that the substrates withstand temperatures on the order of 350°–400° C. CVD film processing has found widespread use in the manufacture of integrated circuits in silicon wafers. Silicon is a conductive material and it can be heated and cooled quite rapidly without breaking or warping the wafer. However, glass is a dielectric material that is very brittle and is subject to warping or cracking when cooled or heated too rapidly. Thus great care must be taken to adjust the rate of heating or cooling of large area glass substrates to avoid thermal stress and resulting damage.

Presently, equipment used for depositing thin films on glass substrates, usually mount several glass substrates on a single large metal carrier plate for processing. The vacuum processing chambers are large, and, because of the thermal mass of the carrier plate and of the glass substrate, heating to processing temperatures requires a lengthy period of time (greater than 20 minutes).

Present day thin film equipment for the semiconductor industry is increasingly moving toward single substrate processing because the individual processing chambers can be made much smaller, processing can be better controlled, and the need for a carrier plate can be eliminated. Further, modern semiconductor equipment is increasingly moving toward systems that can carry out more than one process step on a wafer without removing the wafer from a vacuum environment, which results in reduced particulates which in turn results in fewer rejected devices. Such systems include a central robotic chamber connected to various processing chambers, such as the Applied Materials 5000 series processing systems described in U.S. Pat. No. 4,951,601 to Maydan et al.

It would be desirable to process large glass substrates in similar fashion, depositing multilayer thin films for forming transistors in a single vacuum system using single substrate film processing chambers. Advantages are that smaller processing chambers could be utilized, the vacuum system would be a cleaner system, eliminating or greatly reducing particulate contamination, and the processing could be more controllable and uniform.

However, because of the lengthy period of time required to heat up and cool down the temperature of the glass substrates, e.g., about 5 minutes are required both to heat a large area glass substrate to about 400° C. and to cool it back to room temperature after processing to avoid damage or warpage to the substrate, several glass substrates must be heated or cooled at the same time to improve the throughput of the system.

SUMMARY OF THE INVENTION

We have found that glass substrates for deposition of thin films thereon can be heated to processing temperatures and cooled after processing is completed in novel heating and/or cooling cassettes in a uniform manner to avoid breakage or warpage of the substrates in a vacuum environment using radiation principles to heat and cool the substrates. The glass substrates are heated and cooled in batch-type heating and cooling cassettes of the invention.

Heating and cooling in accordance with the invention are carried out in specially designed cassettes whereby a batch of multiple glass substrates are interleaved with heat conductive shelves. The shelves conduct heat to (heating) or from (cooling) the glass substrates by radiation and gas conduction on both sides of the substrates, thereby providing uniform heating or cooling that avoids cracking or warpage of the substrates. The rate of cooling and heating is governed by the temperature of the shelves, the emissivity of the shelf material and the vacuum pressure. The glass substrates are supported by mounts on the shelves that provide a gap between the glass substrates and the shelves on both sides of the glass. The cassettes can be mounted in heating/cooling vacuum chambers which are part of a glass substrate vacuum handling and processing system.

Systems suitable for applying thin films at high temperatures utilizing the above invention is described in further detail in copending application (Docket No. AM 404) entitled "VACUUM PROCESSING APPARATUS HAVING IMPROVED THROUGHPUT" of Norman Turner et al. incorporated by reference herein.

DETAILED DESCRIPTION OF THE INVENTION

Figure 1A:
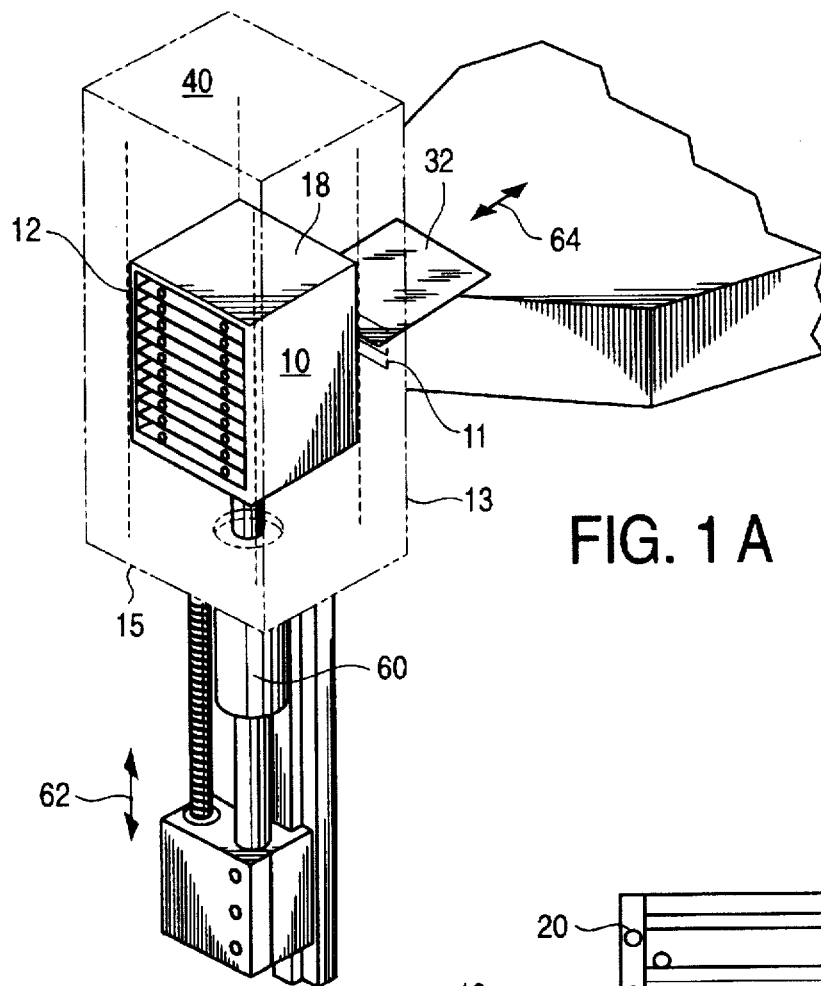
FIG. 1A is a three dimensional view of the present heating/cooling cassette.
Figure 1:
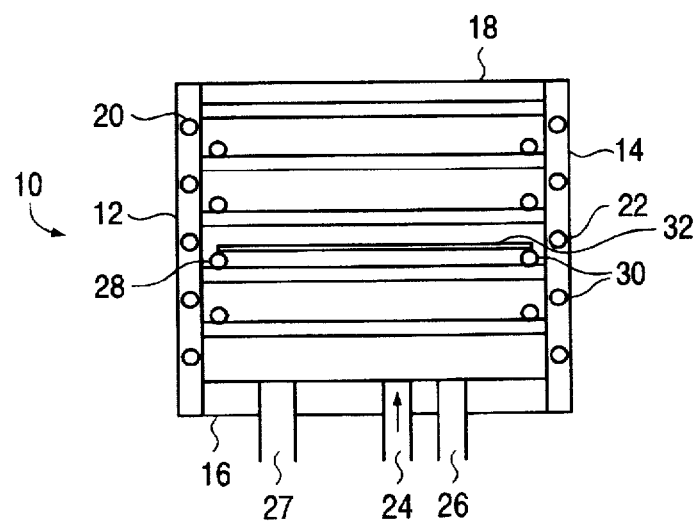
FIG. 1 is a cross sectional view of a cassette suitable for heating and/or cooling large glass substrates.

The heating/cooling cassette of the invention will be further described with reference to FIGS. 1 and 1A which is a cross sectional view and a three dimensional view of the cassette respectively.

A heating/cooling cassette 10 comprises sidewalls 12 and 14 and a bottom wall 16. A lid 18 is fastened to the top of the cassette 10. Additional side walls 13 and 15, shown in FIG. 1A, are opposed to sidewalls 12 and 14. Sidewall 13 is fitted with a slit valve 11 through which the glass plates can be transferred into and out of the cassette 10.

The sidewalls 12 and 14 are fitted with electric resistor heating coils 20 and with cooling channels 22 in which a cooling gas or liquid can be circulated. For example, a cooling gas such as helium or a liquid such as water can be controllably circulated in the channels 22 by means of a suitable pump (not shown).

The bottom wall 16 is fitted with inlet and outlet pipes 24 and 26 respectively for circulation of coolant and/or a channel 27 for containing wires for heating coils 20 which are connected to a source of power (not shown). Alternatively, the same channels 24, 26 can be used for both the wires for the heating coils 20 and for circulating the cooling gas or liquid in the channels 22.

The interior of the sidewalls 12 and 14 are fitted with a plurality of heat conductive shelves 28. The shelves 28 must make good contact with the walls 12 and 14 to ensure rapid and uniform control of the temperature of the shelves 28, depending on whether the walls 12 and 14 are being heated or cooled. The shelves 28 are made of a good heat conductor, such as metal including aluminum, copper, stainless steel clad copper, and the like.

Situate on the shelves 28, or fastened thereto, are a plurality of supports 30 that are suitably made of a non-conductive material such as high temperature glass or quartz. The supports 30 serve to support the glass substrates 32 to be processed so that there is a gap between the shelves 28 and the substrates 32. This gap ensures that direct contact of the shelves to the glass is avoided which might stress and crack the glass. The glass is heated and cooled indirectly by radiation and gas conduction rather than by direct contact of the substrates 32 and the shelves 28. Further, the interleaving of the glass substrates 32 and the shelves 28 provides heating and cooling of the glass substrates 32 from both sides, providing more rapid and more uniform heating and cooling of the substrates.

The temperature of the conductive shelves 28 can be regulated by the heating coils or cooling media in the channels 20, 22 within the sidewalls 12 and 14, to which walls the conductive shelves 28 are contacted or affixed. The conductive shelves 28 must contact the walls 12 and 14 in both the heating or cooling arrangement. The rate of heating or cooling glass substrates is determined by the emissivity of the shelf material, the emissivity of the glass itself and the vacuum pressure of the chamber and can be slow enough so that cracking of the glass is avoided. The heat transport described by the Stephan-Boltzmann equation is given in equation 1) below:

$$E_r = \frac{\sigma \epsilon_1 \epsilon_2}{\epsilon_1 + \epsilon_2 - \epsilon_1 \epsilon_2} (T_1^4 - T_2^4) \quad 1)$$

wherein $E_r$ is the amount of energy transported in Watts/cm$^2$;

$T_1$ is the temperature of the shelves in K°;

$T_2$ is the temperature of the glass in K$_o$;

$\epsilon_1$ is the emissivity of the shelves;

$\epsilon_2$ is the emissivity of the glass; and

σ is the Stefan-Boltzmann constant and heat transfer by gas conduction is proportional to the gas pressure and is given by equation 2) below:

$$E_c = \frac{\Delta(T_1 - T_2)\beta}{d + 2\beta c} \cdot P \quad 2)$$

where $E_c$ is the heating energy in Watts/cm$_2$;

$\Delta$ is the mean conductivity in K$_o$;

d is the gap between planes in cm;

β is the gas accommodation coefficient;

c is the gas mean free path in microns;

P is the pressure in millitorr; and $T_1$ and $T_2$ have the meanings given above for equation 1) The number of substrates in the batch must be adjusted to provide an economic process.

By heating and cooling the glass substrates 32 in a batch-type step, more time is available for heating and cooling of each individual substrate, thus preventing warping or cracking of the glass.

Figure 2:
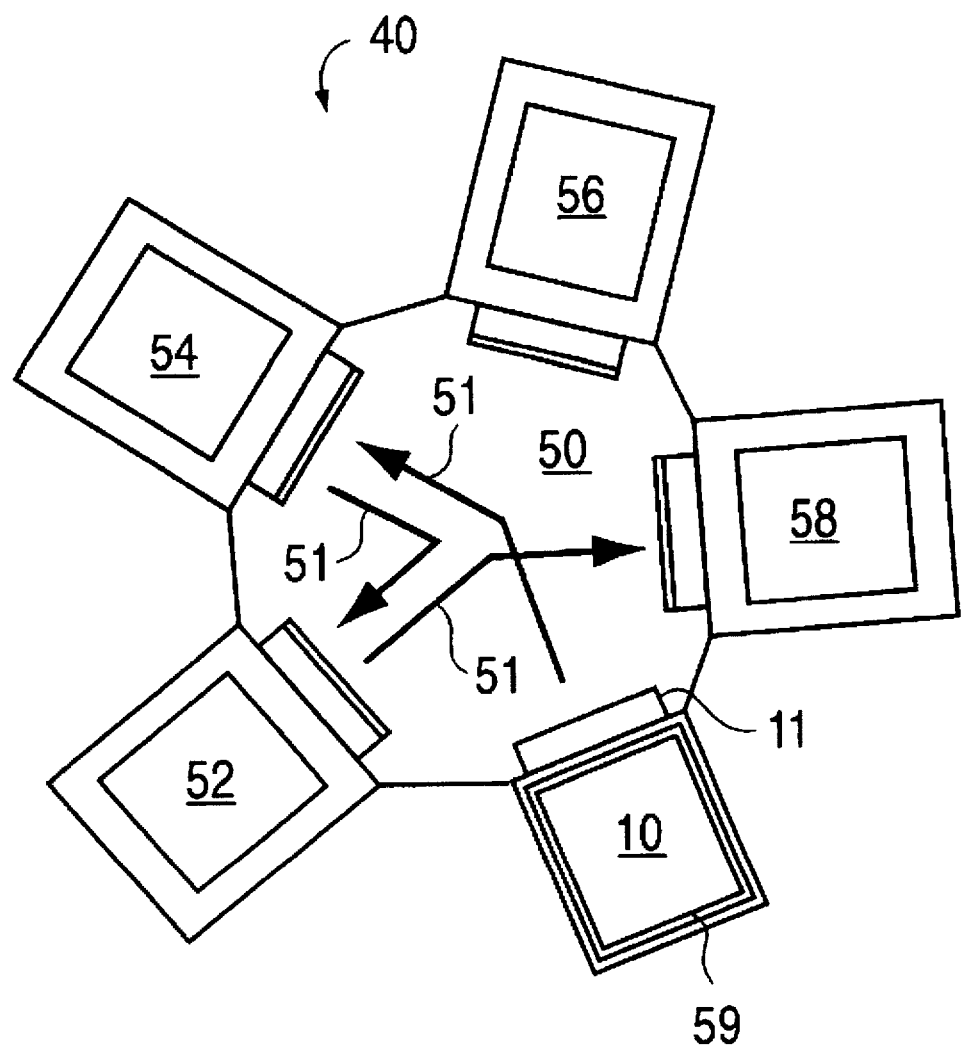
FIG. 2 is a plan view of a glass substrate processing system of which the present heating and/cooling cassettes are a part.

The operation of the system 40 in which the present heating/cooling chambers are used is shown in FIG. 2. A central robotic chamber 50 contains a robot (not shown) that can transfer the glass substrates 32 from the heating/cooling cassette 10 through a suitable opening or slit valve 11 in the sidewall 13 adjacent to the chamber 50. When the glass substrates have reached CVD processing temperature the robot transfers a single substrate 32 to one of the processing chambers 52, 54, 56 or 58 for deposition of a thin film thereon. The robot can also transfer a glass substrate 32 from one of the processing chambers 52, 54, 56 and 58 to another in any predetermined sequence as shown by the arrows 51. After processing is complete, the robot transfers the glass substrate 32 back to the cassette 10 for cooling down to ambient temperatures. Thus a batch of glass substrates 32 are heated up to processing temperature in a cassette of the invention, various thin films are deposited onto them one at a time in the CVD processing chambers, and then a batch of substrates is cooled back to ambient temperature. A slit valve 59 in the sidewall 15 of the chamber 10 allows loading and unloading of the glass substrates 32 into the system 40.

Although the above description of the processing chambers are directed to CVD chambers, other processing chambers can be added or substituted in the vacuum system 40, such as physical vapor deposition chambers, etch chambers, preclean chambers and the like.

Figure 3A:
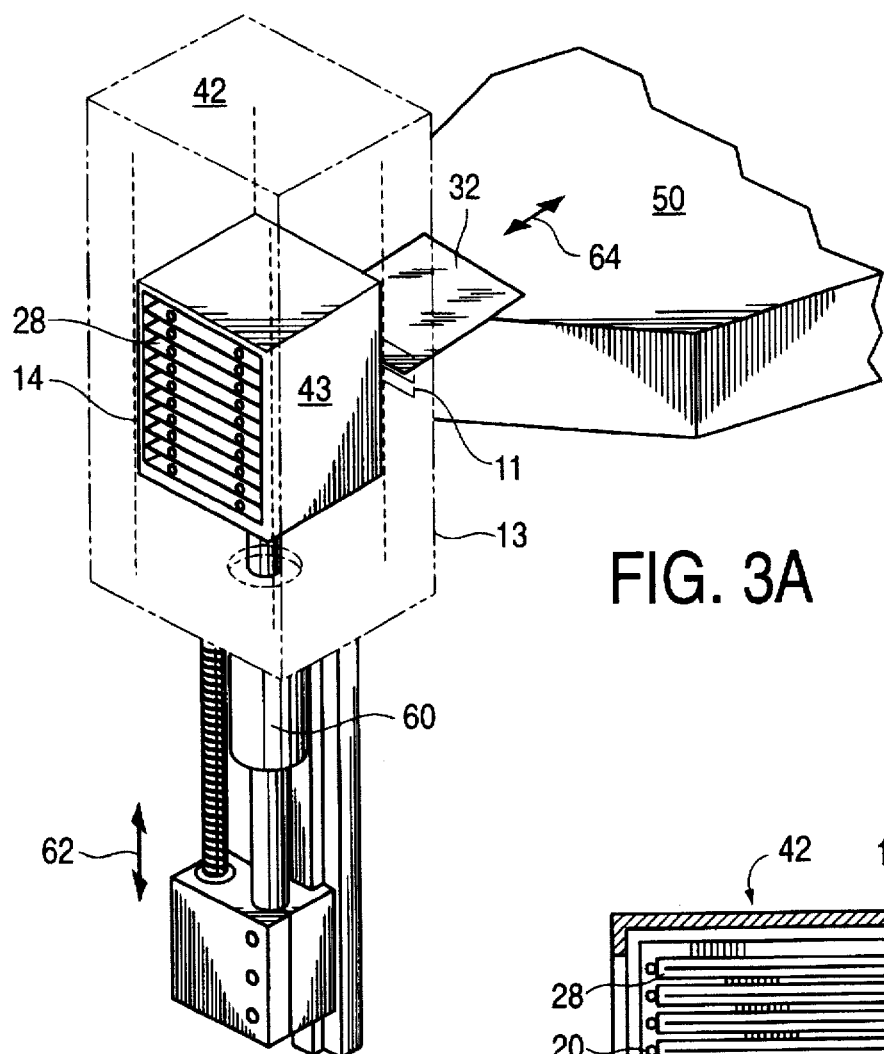
FIG. 3A is a three dimensional view of the heating cassette of FIG. 3.
Figure 3:
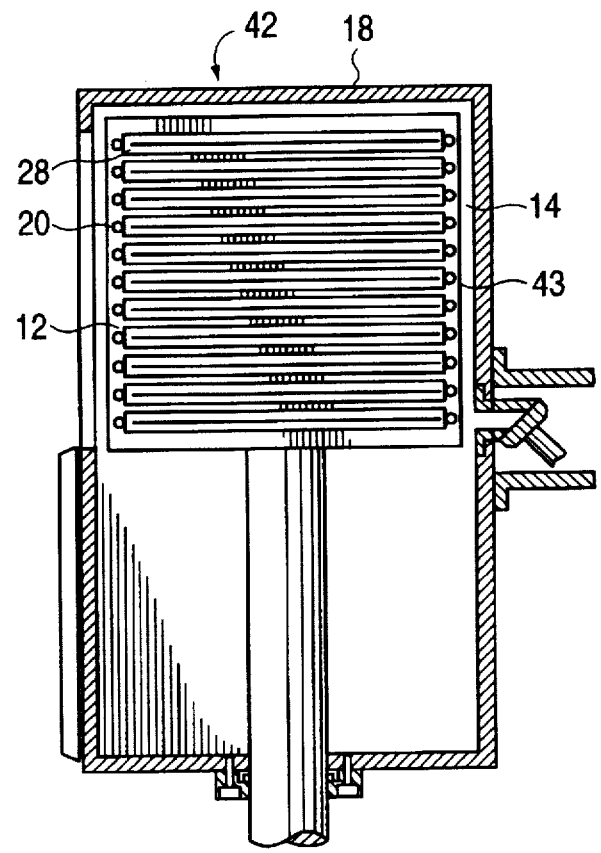
FIG. 3 is a cross sectional view of a heating cassette of the invention.

Alternatively, and in accordance with the preferred embodiments of the invention, separated or integrated heating and cooling chambers 42 and 44 may be provided in the system 40. FIG. 3 is a cross sectional view of a heating chamber 42 and heating cassette 43 of the invention and FIG. 3A is a three dimensional view of the heating chamber 42. The heating chamber 42 includes a heating cassette 43 which contains only resistance heating coils in the sidewalls 12 and 14, and a single slit valve 11 in sidewall 13 connects to the robotic chamber 50.

Figure 4A:
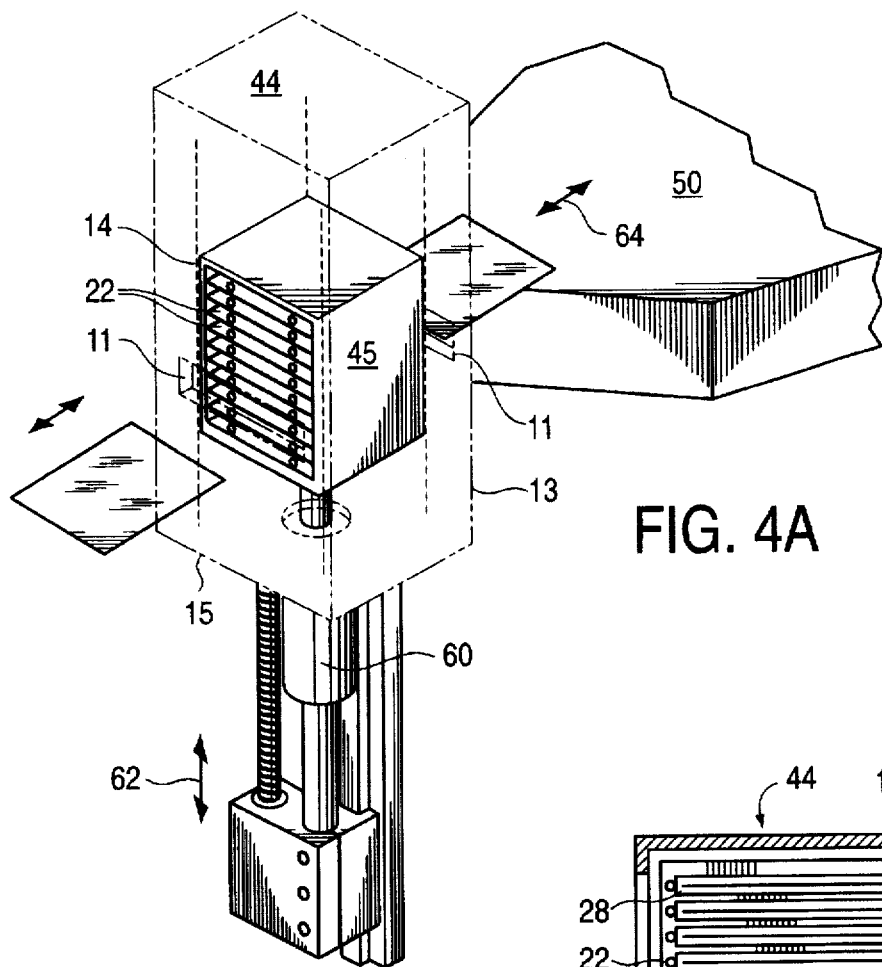
FIG. 4A is a three dimensional view of the load lock/cooling cassette of FIG. 4.
Figure 4:
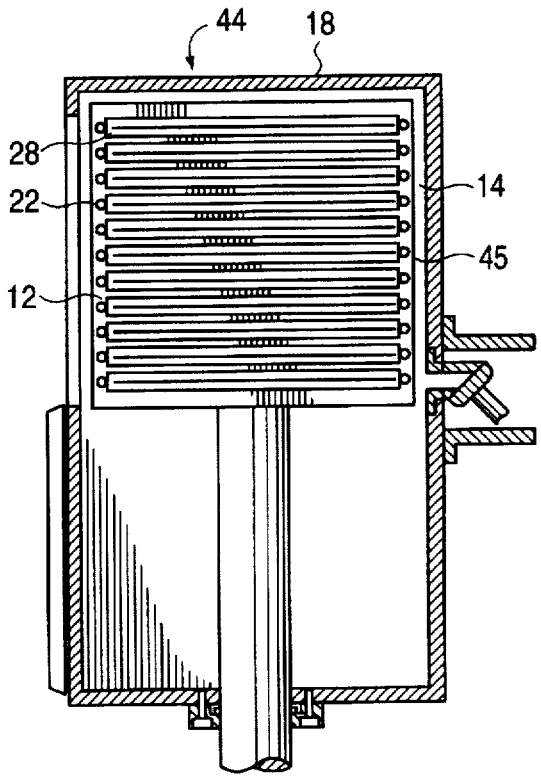
FIG. 4 is a cross sectional view of a load lock/cooling cassette of the invention.

FIGS. 4 and 4A are a cross sectional view and a three dimensional view respectively of a cooling/load lock chamber 44 and cooling cassette 45. The cooling cassette 45 contains only channels for a coolant to be circulated in the sidewalls 12 and 14. However, advantageously the cooling cassette 45 doubles as a load lock chamber and thus each of the sidewalls 13 and 15 have slit valves 11 therein. A batch of substrates is transferred into the cooling chamber 44 through a slit valve 11 (FIG. 4A) in sidewall 15. When all of the shelves are filled, the slit valve 11 is closed and the chamber 44 is brought to vacuum by means of a conventional evacuation pump (not shown). When the desired pressure is reached, a slit valve 11 in the sidewall 13 adjacent to the robot chamber 50 opens to allow the robot to transfer the substrates 32 one at a time to the heating chamber 42. For maximum efficiency of the vacuum system 40, two cooling/load lock chambers 44 are provided so that when one batch of glass substrates 32 are being processed, a second batch of glass substrates 32 is being loaded into the system 40 at atmospheric pressure and brought to vacuum in chamber 44A (see FIG. 5).

Figure 5:
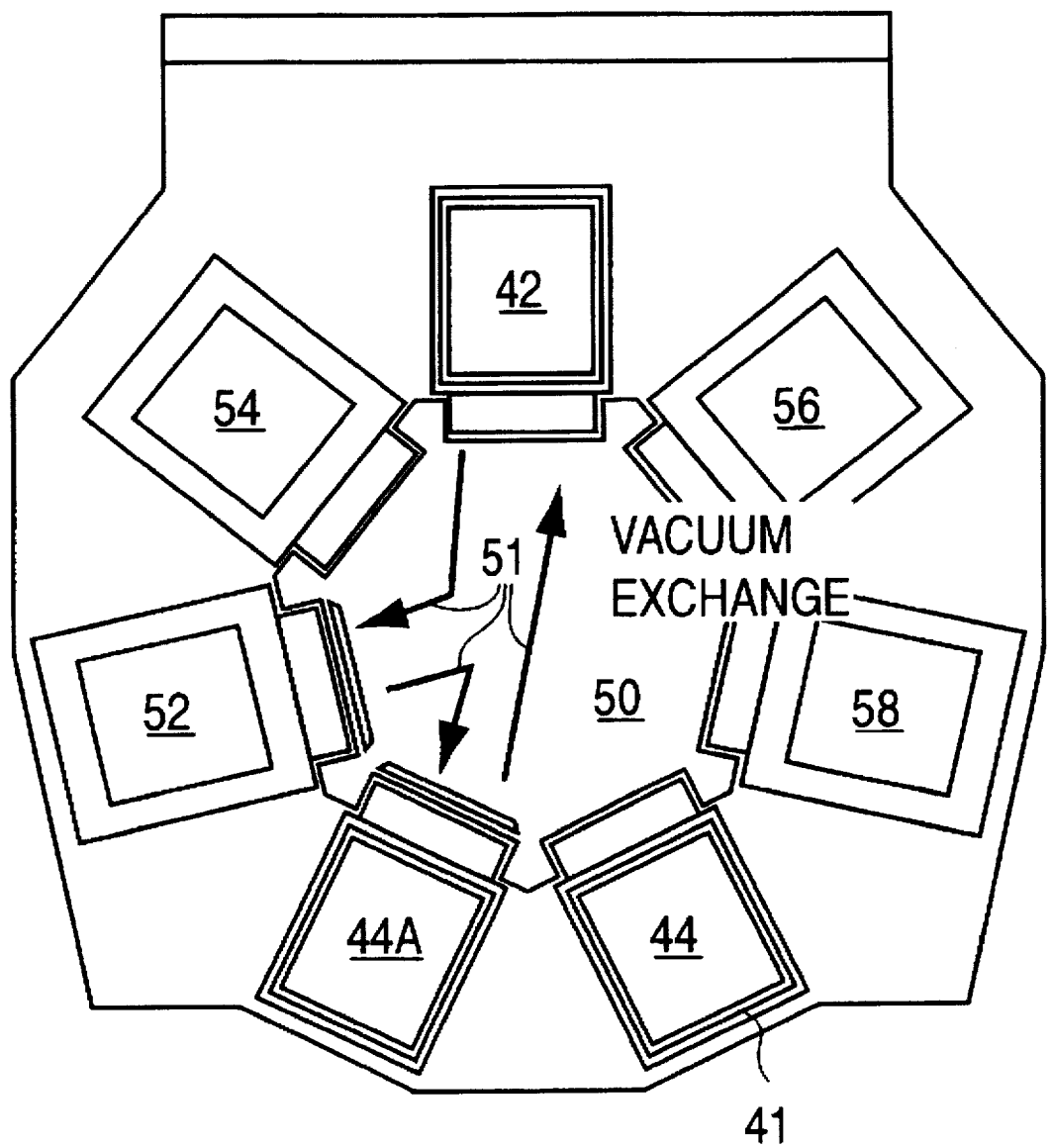
FIG. 5 is an plan view of an alternate embodiment of a glass substrate processing system containing separate heating and cooling cassettes of the invention.

FIG. 5 is a plan view of the preferred embodiment of a vacuum system for processing large area glass substrates, wherein part numbers for similar parts are the same as those described in FIGS. 1–4.

Referring again to FIGS. 1A, 3A and 4A, the heating and cooling cassettes of the invention are mounted on an elevator 60. The elevator can move the cassettes 43 and 45 up and down so that a different conductive shelf 28 is presented to the robot after each transfer of a glass substrate 32. These elevator mechanisms are conventional and do not need to be described in detail herein. The elevator mechanism itself can be outside of the system 40 and connected via a seal through a lower wall of the system 40. Thus the cassettes 43, 45 move in the direction of the arrow 62 and the glass substrates 32 move in the direction of arrow 64 during transfer.

The glass substrates are first loaded into a load lock/cooling cassette where they can be brought under vacuum. The number of glass substrates that can be heated or cooled at once is not critical, and will be chosen depending upon a convenient size of the heating/cooling cassettes, and the relative amount of time required to heat, transfer and process the glass substrates. Then the glass substrates are transported one by one to the heating cassette of the invention where they are radiantly heated to processing temperatures, e.g., about 350°–400° C. After the load lock is emptied, a valve can be closed to vent it to atmosphere, when it is reloaded and pumped down again to vacuum.

The glass substrates are then transferred one-at-a-time to one or more film processing chambers for deposition of one or more thin films thereon. After all depositions are complete, the glass substrate is transferred back to the cooling cassette and a new glass substrate is placed back in the heating cassette. After the last glass substrate is exchanged in the cooling chamber cassette, a slit valve in the vacuum side is closed and the load lock/cooling chamber can be vented to atmosphere. During this time the glass substrates are cooled to about room temperature.

In the alternative and preferred process, a batch of large area glass substrates is transferred into a cassette in a cooling/load lock chamber, where the plates are brought to vacuum, transferred to a heating chamber and heating cassette where they are brought to CVD or other processing temperatures, transferred singly to one or more single substrate processing chambers, transferred back to the cooling cassette in the load lock chamber wherein they are cooled to ambient temperatures and vented to ambient pressure. The substrates can then be transferred out of the vacuum system.

Thus the vacuum heating and/or cooling cassettes of the invention allow radiant heating and cooling from both sides of the glass substrates slowly, avoiding damage to the plates; allowing a plurality of glass substrates to be heated and cooled at once, and greatly improving the economics of the process while maintaining the advantages of one-at-a-time film processing. Further they are compatible with high throughput automated processing.

Although the invention has been described in terms of specific embodiments, those skilled in the art will be aware of various changes that can be made without departing from the spirit of the invention. For example, various other materials can be substituted for the cassettes, shelves, glass substrate supports and the like as described herein; the cassette shelves can be heated or cooled directly by means of suitable channels in the shelves themselves rather than indirectly as described; the cassettes of the invention can be connected to one or more batch-type CVD or other processing chambers; or more than one batch-type heating and/or cooling chamber can be connected to one or more processing chambers; or the heating and/or cooling chambers of the invention can be connected together or to other processing chambers, such as preclean, etch or physical vapor deposition chambers. Thus the invention is meant to be limited only by the scope of the appended claims.

We claim:

1. A method of at least one of heating or cooling substrates in a vacuum system including at least one vacuum chamber, comprising:

a) providing a plurality of thermally-conductive shelves in contact with interior sidewalls of a cassette in said vacuum chamber so that heat is conducted to and from said conductive shelves;

b) supporting the substrates on dielectric supports mounted on said conductive shelves to provide a gap between the substrates and said shelves, thereby avoiding direct contact of the substrates with said shelves; and c) changing the temperature of the interior sidewalls to effect at least one of heating the substrates to a temperature of about 350°–400° C. or cooling the substrates to ambient temperature from a temperature of about 350°–400° C. at a rate to avoid thermal stress in the substrates.

2. A method for heating or cooling glass substrates in a vacuum chamber, comprising:

a) providing a plurality of heat conductive shelves in contact with interior sidewalls of a cassette in the vacuum chamber to conduct heat to and from the shelves to heat or cool the glass substrates by radiant heating or cooling;

b) supporting the glass substrates on dielectric supports to provide a gap between the glass substrates and the shelves to minimize direct thermal contact between the shelves and the glass substrates; and c) at least one of heating or cooling the interior sidewalls to heat the glass substrates to a temperature of about 350°–400° C. or to cool the glass substrates to ambient temperature from a temperature of about 350°–400° C. at a rate to avoid thermal stress in the glass substrates.

3. A method of heating or cooling substrates in a vacuum system, comprising:

a) providing a plurality of thermally-conductive shelves in contact with interior sidewalls of a cassette in a vacuum chamber so that heat is conducted to said conductive shelves;

b) supporting the substrates on dielectric supports mounted on said conductive shelves to provide a gap between the substrates and said shelves, thereby avoiding direct contact of the substrates with said shelves;

c) changing the temperature of the interior sidewalls to effect heating of the substrates to a temperature of about 350°–400° C.;

d) transferring the substrates one-at-a-time to a film processing chamber;

e) depositing one or more thin films on a substrate in said film processing chamber;

f) transferring the substrate from said film processing chamber to a cooling chamber under vacuum and positioning the substrate in a cassette in said cooling chamber by supporting said substrate on dielectric supports mounted on thermally-conductive shelves of said cassette in said cooling chamber so the substrate is interleaved with said shelves, and a gap is formed between the substrate and said shelves; and g) radiantly cooling the substrate.

4. A method according to claim 3 wherein said cooling chamber is vented to atmospheric pressure when all of the substrates therein have been cooled.

5. A method according to claim 3 wherein one or more thin films are deposited by chemical vapor deposition.

* * * * *